(12) United States Patent
Kern

(10) Patent No.: US 9,857,396 B2
(45) Date of Patent: Jan. 2, 2018

(54) DEVICE FOR MEASURING AT LEAST ONE PHYSICAL QUANTITY OF AN ELECTRIC INSTALLATION

(71) Applicant: SOCOMEC, Benfeld (FR)

(72) Inventor: Christian Kern, Sigolsheim (FR)

(73) Assignee: Socomec, Benfeld (FR)

( * ) Notice: Subject to any disclaimer, the term of this patent is extended or adjusted under 35 U.S.C. 154(b) by 0 days.

(21) Appl. No.: 15/125,250

(22) PCT Filed: Mar. 27, 2015

(86) PCT No.: PCT/FR2015/050793
§ 371 (c)(1),
(2) Date: Sep. 12, 2016

(87) PCT Pub. No.: WO2015/150671
PCT Pub. Date: Oct. 8, 2015

(65) Prior Publication Data
US 2017/0138986 A1 May 18, 2017

(30) Foreign Application Priority Data
Apr. 1, 2014 (FR) ...................... 14 52853

(51) Int. Cl.
*G01R 15/18* (2006.01)
*G01R 31/04* (2006.01)

(52) U.S. Cl.
CPC ........... *G01R 15/18* (2013.01); *G01R 15/181* (2013.01); *G01R 31/041* (2013.01)

(58) Field of Classification Search
CPC ..... G01R 15/18; G01R 15/181; G01R 31/041
See application file for complete search history.

(56) References Cited

U.S. PATENT DOCUMENTS 5,218,298 A 6/1993 Vig
5,839,094 A 11/1998 French
(Continued)

FOREIGN PATENT DOCUMENTS

AU 32954/89 B 10/1989
EP 0 342 067 A1 11/1989

OTHER PUBLICATIONS

International Search Report Corresponding to PCT/FR215/050793 dated Aug. 3, 2015.
(Continued)

*Primary Examiner* — Jermele M Hollington
*Assistant Examiner* — Alvaro Fortich
(74) *Attorney, Agent, or Firm* — Davis & Bujold PLLC; Michael J. Bujold

(57) ABSTRACT

A measuring device (10) comprising a current sensor (20) and a measuring unit (40) connected to each other by a connection cable (50). The connection cable (50) comprises three pairs of conductors of which a first measurement pair (51) is arranged to transmit a signal representative of the current measured by the sensor (20), a second power supply pair (52) is arranged to power electrically the sensor (20) and the measuring unit (40), and a third communication pair (53) is arranged to transmit at least one complementary signal between the sensor (20) and the measuring unit (40), such as an identification feature of the sensor allows the measuring unit to recognize automatically the sensor and provide an exploitable correlated value of the current measured by the sensor (20).

18 Claims, 3 Drawing Sheets

(56) References Cited

U.S. PATENT DOCUMENTS

| | | | |
|---|---|---|---|
| 2004/0034658 A1 | 2/2004 | Potter et al. | |
| 2011/0161804 A1* | 6/2011 | Park | H03M 7/707 |
| | | | 715/239 |
| 2011/0270553 A1* | 11/2011 | Ausserlechner | G01R 15/202 |
| | | | 702/64 |
| 2013/0154866 A1* | 6/2013 | Fabregas | H03M 1/12 |
| | | | 341/158 |
| 2014/0022082 A1 | 1/2014 | Wells et al. | |

OTHER PUBLICATIONS

Written Opinion Corresponding to PCT/FR215/050793 dated Aug. 3, 2015.

International Preliminary Report on Patentability Corresponding to PCT/FR2015/050793 dated Apr. 22, 2016.

* cited by examiner

DEVICE FOR MEASURING AT LEAST ONE PHYSICAL QUANTITY OF AN ELECTRIC INSTALLATION

TECHNICAL SCOPE

This invention relates to a device for measuring at least one physical quantity of an electrical installation, comprising at least one sensor arranged to measure at least said physical quantity and provide at least one signal representative of said physical quantity, and at least one measuring unit arranged to receive said signal and process it to deliver at least one exploitable measurement value, said sensor and said measuring unit being connected to each other by means of at least one connection cable, said connection cable comprising at least three pairs of conductors, of which a first pair of conductors called measurement pair arranged to transmit said signal representative of said physical quantity measured by said sensor, a second pair of conductors called power supply pair arranged to electrically power said sensor through said measuring unit, and a third pair of conductors called communication pair arranged to transmit at least one complementary signal between said sensor and said measuring unit, and said sensor comprising encoding means arranged to characterize said sensor and transmit to said measuring unit, through said communication pair, at least one complementary signal that corresponds to at least one identification feature of said sensor.

PRIOR ART

When putting in place power measurement devices on an electrical installation, the installation configuration and check phase is often a source of errors, in particular in three-phase networks. In fact, putting this equipment in place requires placing current and/or voltage sensors on the conductors or phases of the electrical installation and connecting these sensors to measuring units that may be remote. Consequently, the errors made in this installation phase are mainly due to wrong connection of the current measurement channels and of the voltage measurement channels between the sensors and the measuring units, to a wrongly declared sensor range, to a reversal of current sensor polarity, etc. These errors can sometimes be difficult to correct and can even, in certain cases, remain unnoticed for some time, which can lead to wrong measurement values and consequently to incorrect decisions in the management of the electrical installation.

Moreover, the power measuring devices become increasingly accurate while remaining reasonable in terms of costs. Conversely, the precision current sensors remain expensive, as they are based on costly and large magnetic materials. Associating accurate calibration data with simple current sensors, which are analog, cost-effective and inherently inaccurate sensors, it is possible to achieve increased accuracy. However, this calibration data must be transmitted to the measuring device, otherwise the measured values will remain inaccurate. This constraint involves a certain complexity of the current sensor, which necessarily leads to extra cost that is not always justified in view of the considered application.

There are certain current sensors that communicate their calibration data to the measuring devices they are connected to. Publication EP 0 324 067 describes a measurement sensor provided with a transducer and with an evaluation module in which sensor identification data is stored. This identification data is transmitted through connection lines normally used for measurement and power supply. This identification data is thus superimposed to the measurement data and is necessarily digital. The coupling scheme is relatively complex and requires a bidirectional digital link using several distinct signals. Publication US 2014/0022082 describes a process and a device to identify and locate current sensors. The measuring equipment comprises at least one current sensor measuring the current on one conductor of the electrical installation and communicating with a basic unit through a communication cable provided with two pairs of conductors, a first pair for transmitting the current measurement signal and a second pair for sensor identification by means of a resistor whose value is chosen according to said sensor. This measuring device is limited to the recognition of simple analog sensors and its encoding possibilities are very restricted. Publication US 2004/0034658 corresponds to the preamble of claim 1 and describes a "Plug and Play" sensor provided with a transducer performing analog measurements and with an electronic TEDS data card containing the digital identification data of said sensor. This sensor communicates in mixed analog/digital mode with a measuring unit through a communication interface, comprising three pairs of conductors, of which a first pair is used to transmit the analog measurement signal, a second pair for sensor power supply and a third pair to transmit the digital identification data of the sensor. The measuring unit can only recognize sensors provided with digital encoding.

Finally, it may be useful to transmit additional information relating to the current and/or voltage sensors to the measuring unit or vice-versa to enrich the functionalities of said sensors, for example sensor temperature information to increase measurement accuracy, or any other additional information. In fact, the temperature information can be used to perform compensation according to the temperature, but also to provide information about the environment of the sensor that will allow for example to generate an alarm when a critical threshold is exceeded.

Now, in the area of the power measurement of an electrical installation, there are presently no cost-effective current or voltage sensors that would provide additional information to the measuring devices they are connected to. Today, the huge majority of the measuring devices use current sensors in the form of current transformers having a secondary circuit in amperes, with a rated value of 5 A or 1 A, without integrated auxiliary sensor. One notes a trend towards current transformers with a secondary circuit in voltage, the most currently used value being of ⅓V. This evolution allows reducing the price of the current transformers by reducing the size of the magnetic circuits, but brings nothing new in terms of functionality. The user still has to configure the type of the connected sensor: current sensor or voltage sensor, as well as its calibration data. He still can make a mistake about the polarity. And this type of sensors cannot provide any additional function. To correct connection errors, one generally uses an analysis of the phase relationship between the current and the voltage. But this approach presupposes the presence of a significant current and the a priori knowledge of the power factor of the load. Therefore, this connection correction cannot be performed easily prior to commissioning, even though the electrical switchboards are often pre-wired before they are delivered. It would therefore be advantageous to have the possibility to check if the whole wiring has been carried out properly before commissioning the electrical installation.

The solutions currently available on the market are not totally satisfactory.

DESCRIPTION OF THE INVENTION

The present invention aims to overcome these disadvantages by offering an intelligent, modular, economical measuring device that is suitable as well for simple analog sensors as for advanced digital sensors, for the purpose of improving measurement quality and accuracy, without increasing the cost of the sensors or using cheap sensors, making automatic sensor recognition possible, whatever their type, by the measuring devices, allowing checking proper sensor operation and avoiding sensor range transcription errors, the sensor type, the wiring errors, as well as the frauds, in particular by detecting the absence of a sensor.

To that purpose, the invention relates to a measuring device of the kind described in the preamble, characterized in that it is modular and suitable as well for a simple analog sensor as for an advanced digital sensor, in that said measuring unit comprises a processing unit integrating an analog/digital converter connected to said communication pair to receive and process said at least one complementary signal transmitted on at least one of the conductors, whereby this signal can be indifferently an analog or a digital signal and is representative of at least one identification feature of said sensor allowing said measuring unit to automatically recognize the connected sensor and to provide an exploitable correlated value of said measured physical quantity, and in that said measuring unit moreover comprises encoding means complementary to the encoding means provided in said sensor.

If the sensor is an analog one, it comprises advantageously two resistors whose resistance values are chosen according to at least one identification feature of said sensor. In this case, the measuring unit comprises two other resistors arranged to form with the two resistors of said sensor two divider bridges connected on the one hand to said power supply pair and on the other hand to said communication pair to supply to the terminals of said communication pair at least one complementary voltage signal in analog form, representative of said identification feature of said sensor.

If the sensor is a digital one, it comprises advantageously a processing unit in which at least one identification feature of said sensor is recorded, this processing unit being connected on the one hand to said power supply pair and on the other hand to at least one of the conductors of the communication pair to provide at least one complementary signal in digital form, representative of said identification feature of said sensor.

The encoding means can be arranged to transmit to said measuring unit, through said communication pair, several complementary signals corresponding to several identification features of said sensor allowing said measuring unit to recognize said sensor, these identification features can be chosen in the group comprising the rated sensor voltage, the rated sensor current, the sensor calibration data, the sensor gain error compensation curve, the sensor phase error compensation curve.

Said measuring unit can moreover comprise two resistors respectively connected between the conductors of said measurement and power supply pairs in order to polarize the conductors of said measurement pair and detect the presence of said sensor.

The communication pair can be arranged to forward on one of its conductors at least one first complementary signal representative of at least one identification feature of said sensor and on the other of its conductors at least one second complementary signal corresponding to an auxiliary physical quantity of said electrical installation.

The sensor is preferably a current sensor arranged to measure the current on one of the conductors of said electrical installation.

In a first embodiment variant, the measuring device can comprise at least one auxiliary voltage sensor arranged to measure an auxiliary voltage value representative of the voltage present on the conductor whose current is measured by said current sensor, this auxiliary voltage value forming an auxiliary physical quantity forwarded on one of the conductors of said communication pair.

This auxiliary voltage sensor can be incorporated in said current sensor or mounted serially between said current sensor and said measuring unit, and connected to each of them by means of at least one connection cable.

This auxiliary voltage sensor can comprise at least one selector arranged to automatically reverse the connection direction of said auxiliary voltage sensor between said current sensor and said measuring unit in case of a connection error.

In a second embodiment variant, the current sensor can comprise at least one earth leakage current sensor with a very low frequency in comparison with the frequency of the network powering said electrical installation, arranged to measure an earth leakage current value with a bandwidth including at least the frequency of the power supply network, this earth leakage current value forming an auxiliary physical quantity forwarded on one of the conductors of said communication pair.

In a third embodiment variant, the current sensor can comprise at least one temperature sensor arranged to measure the temperature of said current sensor, this temperature forming an auxiliary physical quantity forwarded on one of the conductors of said communication pair.

In a fourth embodiment variant, the current sensor can comprise at least one additional current sensor arranged to perform a second current measurement on the conductor of said electrical installation, this second current measurement forming a physical quantity forwarded on one of the conductors of said communication pair for checking the proper operation of said current sensor by comparing this second current measurement with that performed by said current sensor.

The measuring unit preferably comprises a processing unit including at least one table with correlations between identification features and sensors, and the processing unit is connected to said communication pair to receive at least the complementary signal representative of said identification feature that allows it to automatically recognize the sensor connected to said measuring unit and to provide an exploitable correlated value of said measured physical quantity.

The measuring unit advantageously comprises N current sensors provided each with an auxiliary voltage sensor, and N voltage sensors arranged to measure respectively the current and the voltage on N conductors of said electrical installation. In this case, the measuring unit can comprise a correlation module arranged to match the voltage measurement that corresponds to the auxiliary voltage measurement performed on a same conductor of said electrical installation and automatically correct the possible connection errors of said sensors.

The purpose of the invention is also achieved by the use of the measuring device described previously in order to detect a fraud attempt on said measuring device by detecting an inconsistency in the signals transmitted through said connection cable between said sensor and said measuring unit.

The purpose of the invention is also achieved by the use of the measuring device in order to detect the opening of a cut-off device located upstream of an electrical installation if, on the one hand, the voltage sensor is connected upstream of said cut-off device and if, on the other hand, the current sensor provided with its auxiliary voltage sensor is located downstream of said cut-off device.

BRIEF DESCRIPTION OF THE DRAWINGS

The present invention and its advantages will be better revealed in the following description of several embodiments given as non-limiting examples, in reference to the drawings in appendix, in which.

ILLUSTRATIONS OF THE INVENTION AND VARIOUS WAYS OF REALIZING IT

Figure 1:
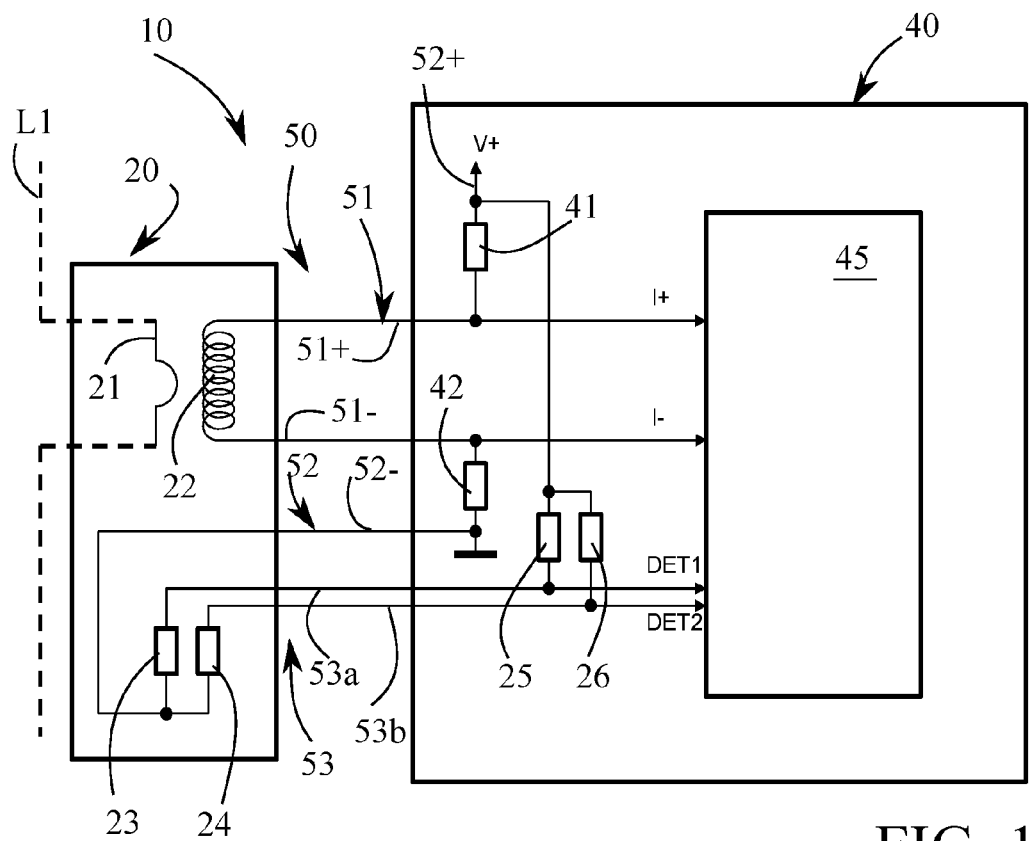
FIG. 1 represents a first measuring device according to the invention provided with a simple current sensor, the encoding being performed by two resistors arranged in said sensor.

Referring to the figures, measuring device 10-13 according to the invention comprises a sensor 20, 20' arranged to measure at least one physical quantity of an electrical installation and a measuring unit 40 coupled with said sensor 20, 20' by means of a specific connection cable 50. In the described and illustrated example, the sensor is a current sensor 20, 20' arranged to measure the current on one L1 of the conductors of the electrical installation, but it can relate to any other sensor type. Current sensor 20, 20' uses existing technologies such as a current transformer, a Rogowski coil, sensors based on magnetic field measurement such as the Hall effect or the "Fluxgate" system, or similar, and provides a signal representative of the measured current, this signal having generally an analog form. This sensor 20, 20' can also be as well a simple analog sensor as an advanced digital sensor. Measuring unit 40 is designed so as to be connected to any type of sensor 20, 20' and thus forms a standard module, identical for each of the configurations illustrated in the figures. It comprises in particular a processing unit 45 represented only in FIG. 1, but present in all embodiments according to FIGS. 2 to 4. This processing unit 45 is programmable and is arranged to receive the signal coming from said current sensor 20, 20'. Processing unit 45 moreover allows processing and exploiting the signal in order to display a measurement value exploitable by an operator and/or a supervision station that can be remote, such as a current, power, energy value, a power factor, a harmonic analysis of the currents and/or of the powers, etc.

Connection cable 50 used to connect current sensor 20, 20' and measuring unit 40 is a modular cable including six positions and six contacts, usually known under the designation RJ12 cable, or any similar cable. This RJ12 cable type, also called Registered Jack 12, is an international standard used by fixed telephone sets. It is also used in the area of local networks. It comprises three pairs of conductors 51, 52, 53. A first pair of conductors 51 is used for the differential transmission of an analog signal representative of a quantity to be measured coming from said current sensor 20, 20', it is further referred to as "measurement pair" and is connected to processing unit 45. A second pair of conductors 52 is used to power sensor 20, 20' through measuring unit 40 and is further referred to as "power supply pair". A third pair of conductors 53 is used to transmit additional information in the form of indifferently analog and digital signals DET1, DET2 between current sensor 20, 20' and measuring unit 40, it is further referred to as "communication pair" and is connected to processing unit 45. Of course, any other connection system comprising at least three pairs of conductors may be used.

Conductors 51+, 51− of measurement pair 51 are polarized by measuring unit 40 by means of two resistors 41, 42 with high values compared to the maximum output resistance of current sensor 20, 20'. A first resistor 41 is connected between one 51+ of the conductors of measurement pair 51 and conductor 52+ with positive polarity of power supply pair 52, and the second resistor 42 is connected between second conductor 51− of measurement pair 51 and conductor 52− with negative polarity of power supply pair 52. When no current sensor is connected to measurement unit 40, the differential voltage on measurement pair 51 is almost constant and close to the voltage of power supply pair 52. When a current sensor 20, 20' is connected, and due to the low output impedance of current sensor 20, 20', the differential voltage on measurement pair 51 is the image of the signal to be measured. Since measuring device 10-13 is intended for measuring alternating signals, the measurement of the average value of this differential voltage signal consequently allows detecting the presence of a current sensor 20, 20'.

FIG. 1 illustrates a first embodiment of measuring device 10 according to the invention comprising a so-called passive simple analog current sensor 20, made of a current transformer, whose primary circuit 21 is formed by conductor L1 of the electrical installation to be controlled and whose secondary circuit 22 is coupled to measurement pair 51. This measurement device 10 comprises encoding means 23, 24 and 25, 26 of said current sensor 20 provided respectively in said sensor 20 and in said measuring unit 40. To that purpose, communication pair 53 is used to form two voltage divider bridges by means of two resistor pairs 23, 24 and 25, 26, present respectively in current sensor 20 and in measuring unit 40. Preferably but not exclusively, one finds on each conductor 53a, 53b of this communication pair 53 a resistor 25, 26 located in measuring unit 40 between conductor 53a, 53b and positive polarity 52+ of power supply pair 52, and a resistor 23, 24 located in current sensor 20 between conductor 53a, 53b and negative polarity 52− of power supply pair 52. More specifically, divider bridge 23, 25 generates a voltage signal DET1, and divider bridge 24, 26 generates a voltage signal DET2. If no sensor 20 is present, signals DET1 and DET2 take the value of the power supply voltage and, when a sensor 20 is present, signals DET1 and DET2 take the analog values comprised between 0 and the power supply voltage. So, the value of the voltage between each conductor 53a, 53b and conductor 52− with negative polarity or conductor 52+ with positive polarity of the power supply voltage depends on the value of resistors 23-26 forming the two voltage divider bridges and, to a certain extent, on the resistance of conductors 53a, 53b of communication pair 53. One can however free oneself from the influence of conductors 53a, 53b using high values for resistors 23-26, typically from some kOhms to some tens of kOhms, compared with the resistances of conductors 53a, 53b, typically from some fractions of Ohm to some tens of Ohms. This voltage on conductors 53a, 53b of communication pair 53 is converted into a digital value by means of an analog/digital converter (not represented) integrated in processing unit 45 of measuring unit 40. It is this way possible to encode about twenty voltage levels on each of the two conductors 53a, 53b of communication pair 53, that is to say about four hundred different voltage values available, thus offering a plurality of codes allowing characterizing a current sensor 20. Of course, the more different levels are chosen, the more encoding possibilities are available, but the more the cables are sensitive to disturbances and to length. These voltage levels are preferably distributed between 0V and the power supply voltage, to provide highest immunity to disturbances. This encoding method allows including in a non-exhaustive manner the rated range of current sensor 20 by choosing the value of resistors 23, 24 in function of said range. Considering the relatively reduced number of ranges to be encoded, that is to say between ten and thirty useful current sensor ranges to cover the needs of the market, one can also use the relatively high number of encoding possibilities to identify further information, such as a typical gain and phase error compensation curve for every current sensor model. One can imagine, for a same current sensor range, several manufacturing technologies according to the desired performance. A current transformer with an Iron/Silicon core will be less expensive than a transformer of the same range with an Iron/Nickel core, but it will also be less accurate. The compensation curve to apply therefore does not depend only on the range, but also on the chosen technology.

Processing unit 45 is programmable and comprises in particular a table with correlations between identification features and current sensors 20, 20' allowing making the correlation with complementary signals DET1, DET2 it receives through communication pair 53, allowing it recognizing automatically the type of current sensor 20, 20' connected to said measuring unit 40 and therefore providing an exploitable correlated value of the physical quantity measured by said current sensor 20, 20'. The analog/digital converter (not represented) integrated in processing unit 45 provides either a digital value allowing determining the ratio of resistors 23/25 and 24/26 if sensor 20 is analog, or, by comparison with a threshold with or without hysteresis, a sequence of binary values if sensor 20' is digital, comprises processing unit 60 and transmits the identification data in the form of a binary data sequence.

Figure 2:
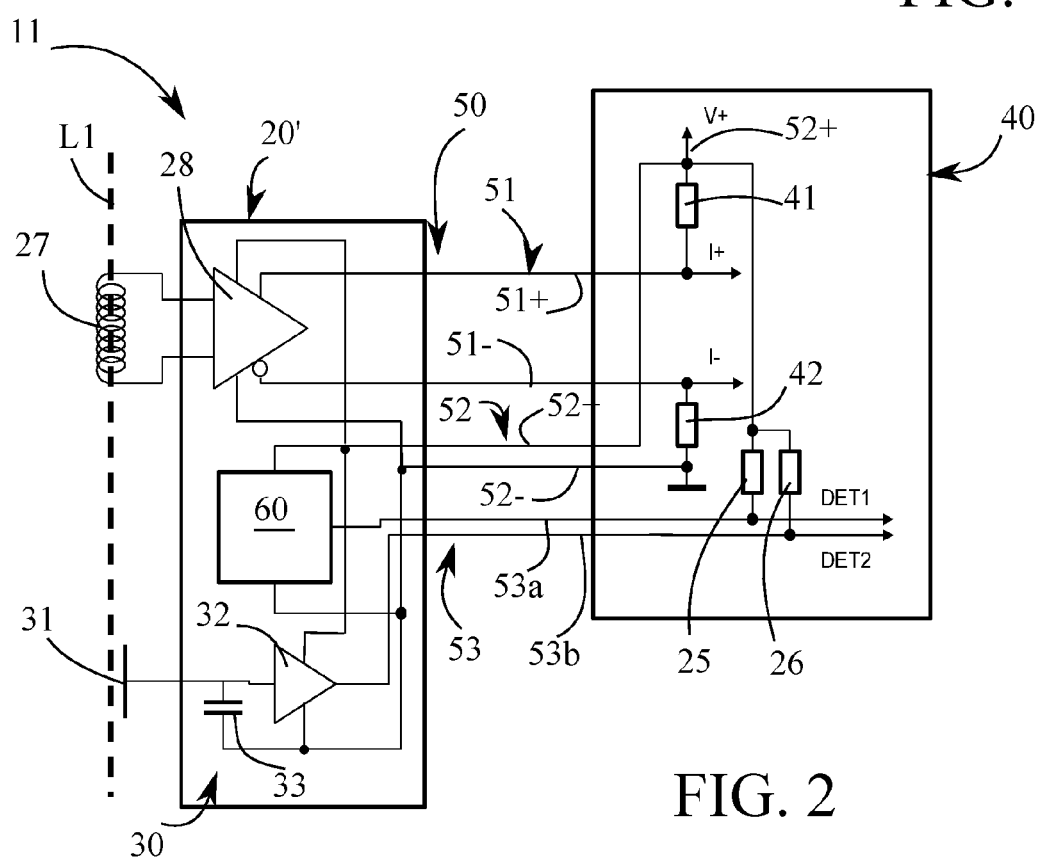
FIG. 2 represents a second measuring device according to the invention provided with an advanced current sensor in the form of an integrator on a Rogowski coil and with an auxiliary voltage sensor in the form of a voltage sensing electrode.

FIG. 2 illustrates a second embodiment of measuring device 11 according to the invention provided with an advanced digital current sensor 20' including a Rogowski coil 27 crossed by conductor L1 of the electrical installation to be controlled, and associated with an integrator 28, powered by conductors 52+, 52− of power supply pair 52, and whose outputs are connected to conductors 51+, 51− of measurement pair 51 connected to processing unit 45 (not represented in this figure). In this embodiment, an auxiliary voltage sensor 30 is integrated in current sensor 20' and arranged to measure an auxiliary voltage value that is the image of the voltage of conductor L1 of the electrical installation on which current sensor 20, 20' is installed, using existing technologies such as capacitive measurement, electric field measurement, resistive measurement, or similar, and to provide a signal representative of the measured voltage, this signal having generally an analog form. The illustrated auxiliary voltage sensor 30 uses a capacitive measurement by means of a non-contact voltage sensing electrode 31 arranged close to conductor L1 of said installation, associated with a capacitor 33 connected to negative conductor 52− of power supply pair 52 and to an amplifier 32, powered by conductors 52+, 52− of power supply pair 52 and connected to one 53b of the conductors of communication pair 53 to transmit a signal DET2 representative of the measured voltage, this signal having generally an analog form. In this embodiment, resistors 23, 24 that allow characterizing current sensor 20 of the previous example are replaced with a processing unit 60, typically a programmable microcontroller, powered by conductors 52+, 52− of power supply pair 52. This processing unit 60 is used to transmit on one 53a of the conductors of communication pair 53 complementary signals DET1 in digital form corresponding to identification features of current sensor 20' connected to measuring unit 40. These identification features can be information about the rated range, a serial number and calibration data allowing accurate compensation of the gain and phase errors due to current sensor 20' as such and no more per current sensor model, as in the previous example. This processing unit 60 also allows transmitting interesting complementary information such as for example the temperature of current sensor 20' and of auxiliary voltage sensor 30. In this case, a temperature sensor must be added in current sensor 20, 20'. When current sensor 20' is made of a Rogowski coil 27 associated with its integrator 28, as is the case in FIG. 2, one knows that it is very difficult to guarantee by construction the accuracy and reproducibility of this type of current sensor because of the mechanical tolerances and of the tolerances on component values. On the other hand, one knows also that it is relatively easy to measure these errors in order to save them afterwards in processing unit 60 of current sensor 20', so as to take them into account during measurement and compensate or correct measurements accordingly.

Figure 3:
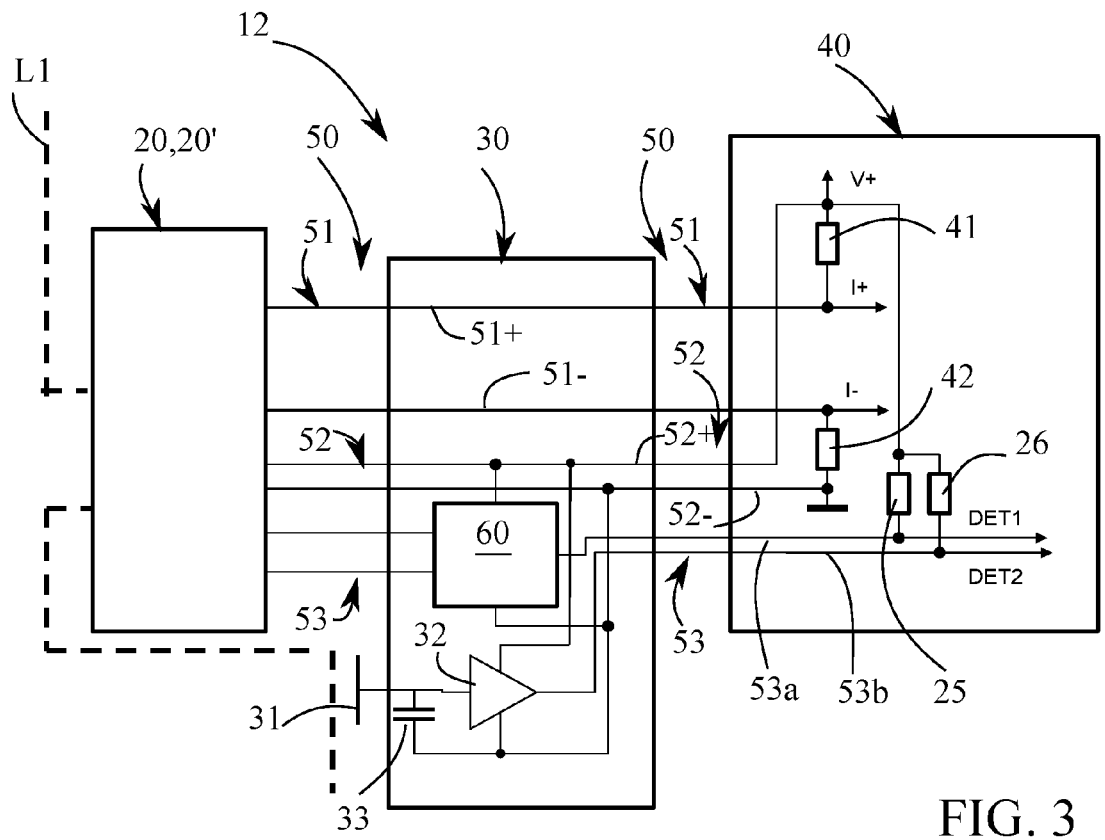
FIG. 3 represents a third measuring device according to the invention provided with an auxiliary voltage sensor separated from the current sensor.

FIG. 3 illustrates a third embodiment of measuring device 12 according to the invention provided with an auxiliary voltage sensor 30 separated from the current sensor, which can be indifferently a simple analog current sensor 20 according to FIG. 1 or an advanced digital current sensor 20' according to FIG. 2. In this case, auxiliary voltage sensor 30 is mounted serially between current sensor 20, 20' and measuring unit 40 by means of two connection cables 50 with six positions.

Figure 4:
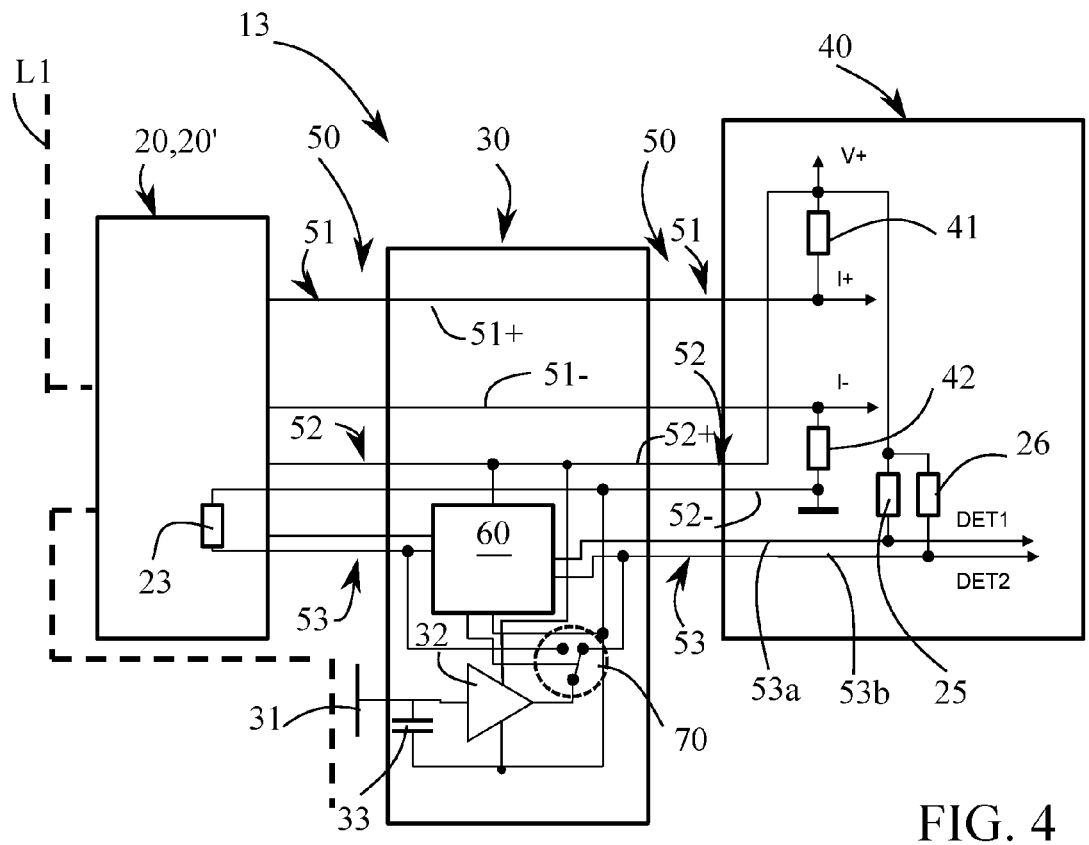
FIG. 4 represents a fourth measuring device according to the invention, similar to that of FIG. 3, but comprising a selector to make the auxiliary voltage sensor reversible.

FIG. 4 represents a fourth embodiment of measuring device 13 according to the invention, similar to that of FIG. 3, but comprising a selector 70 to make auxiliary voltage sensor 30 automatically reversible and simplify the work of the operator. Since auxiliary voltage sensor 30 is connected between current sensor 20, 20' and measuring unit 40, the operator can make a mistake in the direction of connection, as the connectors of connection cables 50 are identical. Processing unit 60 provided in auxiliary voltage sensor 30 is arranged to detect the direction of connection and automatically switch selector 70 to reverse the direction of connection in case of a connection error.

The measuring device 10-13 as it has been described is versatile and features intelligent functions. It is in particular able to differentiate a simple analog current sensor 20, whose encoding is performed by simple resistors 23 to 26, from an advanced digital current sensor 20', whose encoding is performed by a processing unit 60. To that purpose, processing unit 45 provided in measuring unit 40 is arranged to detect an activity, through the presence of a binary signal DET1, on conductor 53a of communication pair 53 possibly supporting the digital transmission in the case of an advanced digital current sensor 20'. If, after a certain time, it does not detect any coherent activity on this conductor 53a, it tries to identify a simple analog current sensor 20 in function of the average voltage levels detected between conductor 53a of communication pair 53 and conductor 52- with negative polarity of power supply pair 52. If it cannot correlate a simple analog current sensor 20 with the detected average voltage levels, it restarts a search for an advanced digital current sensor 20'.

When measuring device 11-13 comprises an advanced digital current sensor 20', for example according to FIG. 2, one 53b of the two conductors of communication pair 53 is unused. One can advantageously, and in a non-exhaustive manner, use this available conductor 53b to transmit a complementary analog signal DET2 that can be used by processing unit 45 and allows improving its knowledge of the environment of current sensor 20', or use this conductor 53b to transmit information to current sensor 20', for example to perform a measurement campaign changing the rated range of current sensor 20' if it has this possibility.

It is also possible to use conductor 53b of communication pair 53 to forward a complementary signal DET2 corresponding to an additional or auxiliary physical quantity of the electrical installation and having for example an analog form. As seen in reference to FIGS. 2 to 4, this complementary signal DET2 can be an auxiliary voltage signal representing the voltage of conductor L1 of the electrical installation whose current is being measured, as allowed by auxiliary voltage sensor 30. This auxiliary voltage signal can be very inaccurate in terms of amplitude, since it is not used for measuring the real voltage on conductor L1, but its shape must be close to the real voltage signal and the time offset with respect to the real voltage signal must be relatively low, in the order of a phase shift of a few degrees with respect to the network frequency equal for example to 50 Hz.

Figure 5:
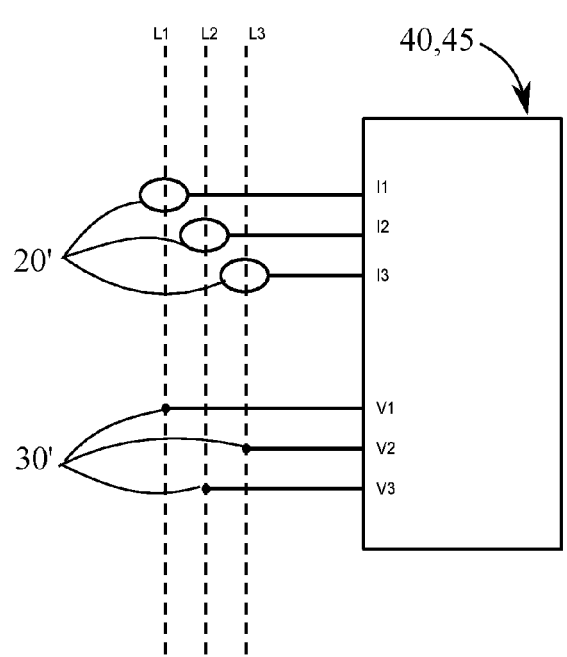
FIG. 5 represents a measuring device according to the invention connected to a three-phase electrical installation showing a connection error between the voltage and current channels corresponding to phases L2 and L3.
Figure 6:
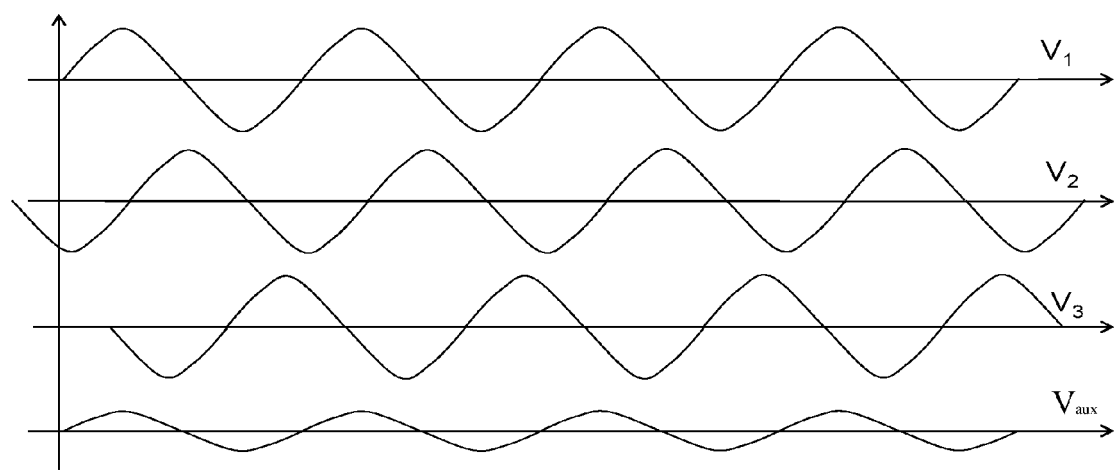
FIG. 6 is a diagram of the voltage signals of the three-phase installation of FIG. 5 and of the auxiliary voltage signal Vaux measured by the measuring device according to the invention provided with a correlation module searching automatically the voltage channel that corresponds best to the measured auxiliary voltage.

Processing unit 45 of measuring unit 40 can comprise a correlation module that allows detecting automatically which is the voltage channel that corresponds to current sensor 20' provided with an auxiliary voltage sensor 30 by looking which one of the rated voltages V1, V2, V3 connected to processing unit 45 shows the highest correlation with auxiliary voltage signal Vaux. FIG. 5 illustrates a connection example between the three phases L1, L2, L3 of the electrical installation and the voltage channels V1, V2, V3 on the one hand and the current channels I1, I2, I3 on the other hand on processing unit 45. In this case, voltage channels V1, V2, V3 are coupled to voltage sensors 30' for example in direct contact to measure the real voltage on each of the phases. A reversed connection has been deliberately introduced between phases L2 and L3 on voltage channels V2 and V3. The diagram of FIG. 6 shows as an example the correlation between auxiliary signal Vaux obtained by auxiliary voltage sensor 30 and voltage channel V1 corresponding to phase L1 of the installation on which current sensor 20' is installed and connected on channel I1 of processing unit 45. Of course, this correlation method can be performed automatically on the other phases L2 and L3 if the current sensors 20' are provided with an auxiliary voltage sensor 30.

In this configuration, the auxiliary signal Vaux, image of the voltage on one L1 of the conductors on which intensity is measured, can also be used to detect the opening of a cut-off device (such as a circuit breaker) or the melting of a fuse in order to trigger an alarm or similar, if voltage sensors 30' feeding voltage channels V1, V2, V3 of processing unit 45 are connected to phases L1, L2, L3 upstream of the cut-off device and if current sensors 20' comprising an auxiliary voltage sensor 30 are connected downstream of said cut-off device.

POSSIBILITIES FOR INDUSTRIAL APPLICATION

The measuring device 10-13 according to the invention uses electrical and electronic components available on the market. It is made intelligent thanks to the integration of programmable processing units 45, 60 and to an indifferently analog and digital communication between current sensors 20, 20' and measuring unit 40, which forms a standardized module. Therefore, measuring device 10-13 is modular, versatile and automatically adapts to any type of current sensors 20, 20', and the same way to any other type of equivalent sensors. This design opens new perspectives for the exploitation of the physical quantities of an electrical installation and therefore allows multiple applications tending towards higher safety and better reliability of the measured data.

As an example, within the framework of an energy counting application, the use of measuring device 10-13 according to the invention makes fraud particularly delicate. In fact, this measuring device 10-13 is able to detect the absence of a current sensor thanks to resistors 41, 42 provided in measuring unit 40, the rated range of a current sensor, the replacement of a current sensor by checking the serial number, inconsistencies between the voltages measured directly by measuring device 40 connected to current sensor(s) 20, 20', said measuring device 40 being in fact an energy counter, and those detected by auxiliary voltage sensor 30, etc.

Likewise, the exploitation of an auxiliary signal can also allow improving the reliability of the search for earth faults in electrical installations isolated from earth. In this case, the current sensor comprises an earth leakage current sensor. The useful signal for measuring the resistive earth faults is generally a very low-frequency, low amplitude current signal that is often superimposed to a current signal present on the conductor at network frequency, with a much higher amplitude. To be able to process correctly the useful very low-frequency signal, one performs low-pass filtering of the global signal in order to be able to amplify properly the very low-frequency signal. However, the earth leakage current signal of the installation to be controlled can include a component at network frequency (for example 50 Hz) that can have a much higher amplitude than the low-frequency component transmitted on measurement pair 51. This component at network frequency can provide interesting information, in particular to check the absence of saturation of the earth leakage current sensor and the proper use of the earth leakage current sensor in a current range compatible with the resistive earth faults search application. Conductor 53b of communication pair 53 can therefore be used to provide the unfiltered image of the earth leakage current and to trigger an alarm if necessary.

Another example for the exploitation of an auxiliary signal can be a signal providing an information about the same physical quantity as that already measured, for example a current signal, but obtained on a different and less accurate way by a cheap additional current sensor. The comparison of the two signals representative of a same physical quantity can allow detecting a failure of main current sensor 20, 20' and therefore has its place in measuring devices 10-13 for which operating safety is an important criterion.

These various embodiment examples show perfectly the great flexibility of use of this measuring device 10-13, as well as its exploitation possibilities thanks in particular to connection cable 50 that connects current sensors 20, 20' and auxiliary voltage sensor 30 to measuring unit 40, allowing forwarding other information than the values of the quantities measured by said sensors, while this information can be infinite and used to ensure multiple functions such as anomaly, fraud and/or cut-off detection, control, monitoring, safety, etc.

The present invention is not restricted to the examples of embodiment described, but extends to any modification and variant which is obvious to a person skilled in the art while remaining within the scope of the protection defined in the attached claims.

The invention claimed is:

1. A measuring device (10-13) for measuring at least one physical quantity of an electrical installation, the device comprising:
    at least one sensor (20, 20') being arranged to measure at least the physical quantity and provide at least one signal representative of the physical quantity,
    at least one measuring circuit (40) being arranged to receive the signal and process the signal to deliver at least one exploitable measurement value,
    the sensor and the measuring unit being connected to one another by at least one connection cable (50),
    the connection cable (50) comprising at least three pairs of conductors of which a first pair of conductors (51+, 51−), called a measurement pair (51), being arranged to transmit the signal representative of the physical quantity measured by the sensor (20, 20'), a second pair of conductors (52+, 52−), called a power supply pair (52), being arranged to power electrically the sensor (20, 20') through the measuring circuit (40), and a third pair of conductors (53a, 53b), called a communication pair (53), being arranged to transmit at least one complementary signal (DET1, DET2) between the sensor (20, 20') and the measuring circuit (40), and
    the sensor (20, 20') comprising encoding circuitry (23, 24; 60) arranged to characterize the sensor and transmit to the measuring circuit (40), through the communication pair (53), the at least one complementary signal (DET1, DET2) that corresponds to at least one identification feature of the sensor (20, 20'),
    wherein the measuring device (10-13) is modular and suitable for an analog or a digital sensor, the measuring circuit (40) is designed to be able to be connected to the sensor (20, 20') and form a module, the measuring circuit (40) comprises a processing unit (45) integrating an analog/digital converter, connected to the communication pair (53), to receive and process the at least one complementary signal (DET1, DET2) transmitted on at least one of conductors (53a, 53b) of the communication pair (53), whereby this signal can be either an analog signal or a digital signal and is representative of at least one identification feature of the sensor (20, 20') allowing the measuring circuit (40) to automatically recognize the sensor (20, 20') connected to the measuring circuit (40) and to provide an exploitable correlated value of the measured physical quantity, and the measuring circuit (40) comprises encoding circuitry (25, 26) which is complementary to the encoding circuitry (23, 24, 60) provided in the sensor (20, 20').

2. The measuring device according to claim 1, wherein the sensor (20) is an analog sensor and comprises two resistors (23, 24) whose resistance values are chosen according to at least one identification feature of the sensor, and the encoding circuitry of the measuring circuit (40) comprise two other resistors (25, 26) arranged to form with the two resistors (23, 24) of the sensor (20), two voltage divider bridges connected, on one hand, to the power supply pair (52) and, on other hand, to the communication pair (53) to provide to terminals of the communication pair (53) on the processing unit (45) of the measuring circuit (40) at least one complementary voltage signal (DET1, DET2) in analog form, representative of the identification feature of the sensor (20).

3. The measuring device according to claim 1, wherein the sensor (20') is a digital sensor and comprises a processing unit (60) in which at least one identification feature of the sensor (20') is recorded, the processing unit is connected, on one hand, to the power supply pair (52) and, on other hand, to at least one (53a) of conductors of the communication pair (53) to provide to the processing unit (45) of the measuring circuit (40) at least one complementary signal (DET1, DET2) in digital form, representative of the identification feature of the sensor (20').

4. The measuring device according to claim 1, wherein the encoding circuitry (23, 24; 60) of the sensors (20, 20') are arranged to transmit to processing unit (45) of the measuring circuit (40), through the communication pair (53), several complementary signals (DET1, DET2) correspond to several identification features of the sensor allowing the measuring circuit (40) to recognize the sensor (20, 20'), the identification features of the sensor (20, 20') are chosen in the group comprising a rated sensor voltage, a rated sensor current, a sensor calibration data, a sensor gain error compensation curve, and a sensor phase error compensation curve.

5. The measuring device according to claim 1, wherein the measuring circuit (40) comprises two resistors (41, 42) respectively connected between the first pair of conductors and the second pair of conductors (51+, 52+; 51−, 52−) of the measurement pair (51) and the power supply (52) pairs in order to polarize the conductors (51+, 51−) of the measurement pair (51) and detect a presence of the sensor (20, 20').

6. The measuring device according to claim 1, wherein the communication pair (53) is arranged to forward on one of its conductors (53a) at least one first complementary signal (DET1), representative of at least one identification feature of the sensor (20, 20'), and, on the other of its conductors (53b), at least one second complementary signal (DET2) corresponding to an auxiliary physical quantity of the electrical installation.

7. The measuring device according to claim 1, wherein the sensor (20, 20') is a current sensor arranged to measure a current on at least a first phase (L1) of the electrical installation.

8. The measuring device according to claim 7, wherein the measuring device comprises at least one auxiliary voltage sensor (30) arranged to measure an auxiliary voltage value representative of a voltage present on the first phase (L1) of the electrical installation whose current is measured by the current sensor (20, 20'), and the auxiliary voltage value forms an auxiliary physical quantity forwarded on one of the conductors (53*b*) of the communication pair (53).

9. The measuring device according to claim 8, wherein the auxiliary voltage sensor (30) is integrated in the current sensor (20, 20').

10. The measuring device according to claim 8, wherein the auxiliary voltage sensor (30) is serially mounted between the current sensor (20, 20') and the measuring circuit (40) and is connected thereto by at least one connection cable (50).

11. The measuring device according to claim 10, wherein the auxiliary voltage sensor (30) comprises at least one selector (70) arranged to reverse automatically a connection direction, in case of a connection error, of the auxiliary voltage sensor (30) between the current sensor (20, 20') and the measuring circuit (40).

12. The measuring device according to claim 7, wherein the current sensor (20, 20') comprises at least one earth leakage current sensor with a low frequency in comparison with a frequency of a network powering the electrical installation, arranged to measure an earth leakage current value with a bandwidth which includes at least a frequency of a power supply network, and the earth leakage current value forming the auxiliary physical quantity forwarded on to one of the conductors (53*b*) of the communication pair (53).

13. The measuring device according to claim 7, wherein the current sensor (20, 20') comprises at least one temperature sensor arranged to measure a temperature of the current sensor, and the temperature forms the auxiliary physical quantity forwarded on to one of the conductors (53*b*) of the communication pair (53).

14. The measuring device according to claim 7, wherein the current sensor (20, 20') comprises at least one additional current sensor arranged to perform a second current measurement on the first phase (L1) of the electrical installation, and the second current measurement forms a physical quantity forwarded on to one of the conductors (53) of the communication pair (53) for checking proper operation of the current sensor (20, 20') by comparing a second current measurement with that performed by the current sensor (20, 20').

15. The measuring device according to claim 1, wherein the processing unit (45) provided in the measuring circuit (40) includes at least one table with correlations between identification features of the sensors (20, 20') and the sensors (20, 20').

16. The measuring device according to claim 8, wherein the measuring device comprises N current sensors (20, 20') each provided with an auxiliary voltage sensor (30) arranged to measure current on N phases (L1, L2, L3) of the electrical installation, and N voltage sensors (30') arranged to measure voltage on the N phases (L1, L2, L3) of the electrical installation, and the measuring circuit (40) comprises a correlation module arranged to match the voltage measurement (V1, V2, V3) that corresponds to the auxiliary voltage measurement (Vaux1, Vaux2, Vaux3) performed on each of the N phases (L1, L2, L3) of the electrical installation and automatically correct possible connection errors of the sensors (20, 20', 30').

17. The measuring device according to claim 1, wherein the measuring device is used to detect a fraud attempt on the measuring device by detecting an inconsistency in the signals transmitted through the connection cable (50) between the sensor (20, 20') and the measuring circuit (40).

18. The measuring device according to claim 17, wherein the measuring device is used to detect opening of a cut-off device, located upstream of an electrical installation, if, on one hand, the voltage sensor (30') is connected upstream of the cut-off device and if, on another hand, the sensor (20') provided with an auxiliary voltage sensor (30) is located downstream of the cut-off device.

* * * * *